United States Patent [19]

Calhoun et al.

[11] Patent Number: 5,219,655

[45] Date of Patent: Jun. 15, 1993

[54] COMPOSITE INCLUDING AN INORGANIC IMAGE AND METHOD OF TRANSFERRING SUCH AN IMAGE

[75] Inventors: Clyde D. Calhoun, Stillwater; David C. Koskenmaki, St. Paul, both of Minn.

[73] Assignee: Minnesota Mining and Manufacturing Company, St. Paul, Minn.

[21] Appl. No.: 650,475

[22] Filed: Feb. 4, 1991

Related U.S. Application Data

[62] Division of Ser. No. 300,334, Jan. 23, 1989, Pat. No. 5,017,255.

[51] Int. Cl.$^5$ .......................... B32B 3/00; B32B 3/30; B32B 7/14; B32B 15/08
[52] U.S. Cl. .................... 428/344; 428/164; 428/202; 428/209; 428/457; 428/458; 428/901
[58] Field of Search ............. 428/344, 202, 164, 163, 428/40, 209, 901, 457, 458; 156/233

[56] References Cited

U.S. PATENT DOCUMENTS

| | | | |
|---|---|---|---|
| 2,932,590 | 4/1960 | Barvett et al. | 117/201 |
| 3,054,175 | 9/1962 | Spreter | 29/527 |
| 3,227,132 | 1/1966 | Clough et al. | 118/49 |
| 3,350,250 | 10/1967 | Sanz et al. | 156/150 |
| 3,540,047 | 11/1970 | Walser et al. | 343/18 |
| 3,847,659 | 11/1974 | Sobajima et al. | 117/217 |
| 4,094,675 | 6/1978 | Beschoner et al. | 96/1.5 |
| 4,153,494 | 5/1979 | Vilapriayo Oliva | 156/230 |
| 4,215,170 | 7/1980 | Vilapriayo Oliva | 428/328 |
| 4,246,297 | 1/1981 | Nablo et al. | 427/44 |
| 4,336,277 | 6/1982 | Bunshah et al. | 427/38 |
| 4,363,844 | 12/1982 | Lewis et al. | 428/163 X |
| 4,367,745 | 1/1983 | Welage | 128/303.13 |
| 4,393,120 | 7/1983 | Watai et al. | 428/457 |
| 4,394,210 | 7/1983 | Morimoto et al. | 156/608 |
| 4,469,714 | 8/1984 | Wada et al. | 427/54.1 |
| 4,490,409 | 12/1984 | Nablo | 427/44 |
| 4,500,567 | 2/1985 | Kato et al. | 427/255.3 |
| 4,521,445 | 6/1985 | Nablo et al. | 427/44 |
| 4,537,811 | 8/1985 | Nablo et al. | 428/166 |
| 4,591,527 | 5/1986 | Czichy | 428/202 X |
| 4,600,654 | 7/1986 | Linder | 428/432 |
| 4,642,244 | 2/1987 | Tripp, III et al. | 427/44 |
| 4,718,963 | 1/1988 | Poll et al. | 156/232 |

FOREIGN PATENT DOCUMENTS

| | | |
|---|---|---|
| 53-127018 | 11/1978 | Japan . |
| 8418847A2 | 10/1984 | Japan . |
| 8628920A2 | 12/1986 | Japan . |

OTHER PUBLICATIONS

A. L. Dawar, J. C. Joshi, "Semiconducting Transparent Thin Films: Their Properties and Applications," *Journal of Materials Science* 19 (1984), pp. 1-23.

G. Haacke, "Transparent Conducting Coatings," *Annual Review of Material Science* (1977), pp. 73-91.

A. M. Jarzebski, "Preparation and Physical Properties of Transparent Conducting Oxide Films," *Physical Status Solidi* (1982), pp. 13-41.

*Primary Examiner*—George F. Lesmes
*Assistant Examiner*—D. R. Zirker
*Attorney, Agent, or Firm*—Merchant, Gould, Smith, Edell, Welter & Schmidt

[57] ABSTRACT

A method of forming a transferable pattern or image of an inorganic film by coating an embossed substrate with an inorganic layer, that may comprise one or more films, over both recessed and raised surface portions, adhesively laminating a transfer substrate to the inorganic layer coating the raised surface portions of the embossed substrate and separating the embossed substrate and the transfer substrate. The adhesive is selected such that the bond between the transfer substrate and the inorganic film on the raised surface portions is greater than the bond between the inorganic layer on the raised surface portions and the embossed substrate.

The embossed substrate resulting after removal of the inorganic layer coating the raised surface portions may be modified to include additional inorganic layers over the recessed surface portions by tinning or electroplating methods such that this thickened inorganic layer may also be transferred from the embossed substrate to a transfer substrate a set forth above.

21 Claims, 4 Drawing Sheets

COMPOSITE INCLUDING AN INORGANIC IMAGE AND METHOD OF TRANSFERRING SUCH AN IMAGE

This is a division of application Ser. No. 07/300,334, filed Jan. 23, 1989, now U.S. Pat. No. 5,017,255.

TECHNICAL FIELD

Broadly, the present invention relates to inorganic film imaging and methods of transferring such an inorganic pattern or image to a substrate. More specifically, the present invention relates to metal film imaging and methods of transferring such a metal pattern or image to a substrate.

BACKGROUND OF THE INVENTION

A wide variety of thin metal film patterns are known and used in a variety of different applications Metal films are often used for either their decorative and aesthetic characteristics, including specular reflectance, or their ability to conduct electricity. Examples of decorative uses include the use of metallic patterns upon wallpaper, greeting cards, labels, business cards, book covers, name plates, automobiles, bicycles, and the like. An example of the use of thin metal film images for their electrical conductivity is printed circuit boards Detailed patterns of electrically conductive metal films are used to make flexible printed circuits used in computer applications and the like. Patterns used for such flexible conductive circuits are often extremely detailed with up to 100 individual and separate lines of metal per cm.

Metallic patterns can also be used to control static electricity and protect against electromagnetic radiation while permitting substantial portions of visible light to pass therethrough. This allows the pattern to protect an article surrounded thereby from electromagnetic radiation and static electricity while permitting viewing of the article through the pattern.

For many of these end uses, it is desirable to be able to transfer the metal image or pattern from a carrier substrate or the like to its ultimate position upon a substrate. For example, it may be desirable to transfer a pattern onto an automobile tail light or onto a greeting card by simply pressing a carrier substrate containing the image onto the tail light or greeting card and then removing the carrier substrate. Likewise, it may be desirable to transfer such a metal image to a package to protect the contents of the package from static electricity.

Accordingly, there is a need for a quick and simple method of transferring a metal pattern or image, preferably of fine detail, to a transfer substrate. Likewise, a need also exists for a metal image or pattern transfer sheet or tape which can quickly and easily transfer a metal pattern or image from the tape or sheet to a transfer substrate.

There is also a need for a conductive metal film substrate composite that has an embossed surface and contains metal film only within the recessed, grooves of the embossed surface. Such a composite can be used to make containers that can protect a component from static electricity without crayoning. Crayon, as used herein, refers to the undesired transfer of conductive material to an electronic component, such as from the above-referenced container to a component stored therein.

A need also exists for a method of forming a pattern of multilayered inorganic films on a substrate that does not involve etching and can be carried out at high production rates.

SUMMARY OF THE INVENTION

The present invention provides a method of transferring an image to a transfer substrate compromising the steps of: (a) providing an embossed substrate having a relief surface that includes a raised surface portion and a recessed surface portion; (b) depositing an inorganic layer onto said relief surface thereby providing an image layer on the raised surface portion wherein a bond of strength X is formed between the image layer and the raised surface portion of the embossed substrate; (c) providing a layer of adhesive on at least the image layer; (d) contacting the layer of adhesive with a transfer substrate; (e) forming an adhesive bond of strength Y between the transfer substrate and the image layer, wherein Y is greater than X; and (f) separating the embossed substrate and the transfer substrate and thereby transferring the image layer to the transfer substrate. The embossed substrate is preferably a flexible polymeric material. Alternatively, the following can be substituted for steps (a) and (b): an embossable substrate is provided in unembossed form, the inorganic layer is deposited upon a first surface of the substrate and then the first surface of the unembossed substrate is embossed to form the relief surface coated with an inorganic layer.

The present invention also provides a method of making an image transfer sheet or tape by the method set forth above by simply replacing the transfer substrate with a release liner. The sheet or tape can then be used at a remote location to transfer the image layer to a transfer substrate by removing the release liner and contacting the exposed surface of the image transfer tape or sheet to the transfer substrate.

The present invention also provides an inorganic image/substrate composite comprising: (i) an embossed substrate having a relief pattern formed therein, that includes a raised surface portion and a recessed surface portion, (ii) first and second inorganic layers adhered to the raised surface portion and the recessed surface portion, respectively, and preferably (iii) an adhesive layer coated onto the first inorganic layer adhered to the raised surface portion of the substrate.

The present invention also provides a method of making a transparent and conductive composite comprising an embossed substrate having a metal layer restricted to the recessed surface portion of the embossed substrate and an article so made.

The present invention also provides a method of making a pattern including inorganic layers comprising multiple inorganic films and an article so made.

The present invention also provides a method of making an image of a conductive inorganic layer on a substrate that is inexpensive to manufacture and has excellent bonding of the metal to the substrate, and an article so made.

As used herein "image layer" refers to an inorganic layer deposited onto the raised surface portion of an embossed substrate. The "image layer" is the image or pattern that can be readily transferred from the embossed substrate to a transfer substrate. The "image layer" may consist of one or more inorganic films.

DETAILED DESCRIPTION OF THE INVENTION

Figure 1:
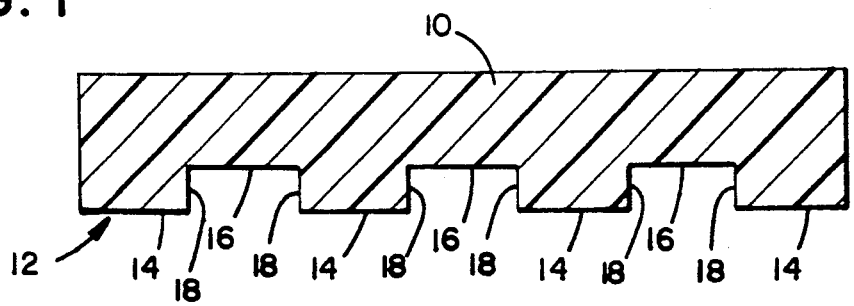
FIG. 1 is a schematic cross-section of an embossed substrate useful in the present invention.

Referring to FIG. 1, an embossed substrate 10 is shown having a relief surface 12 which includes raised surface portions 14, recessed surface portions 16, and sidewalls 18.

Figure 2:
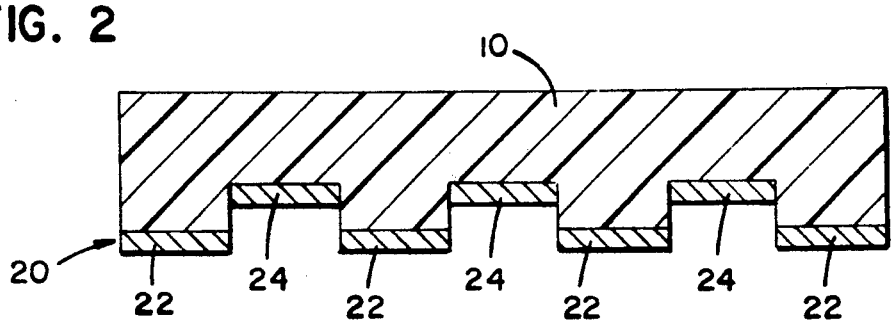
FIG. 2 is a schematic cross-section of the embossed substrate of FIG. 1 having an inorganic layer deposited upon the embossed surface.

Referring to FIG. 2, an inorganic layer 20 is shown which includes a first inorganic layer 22 coating the raised surfaces 14 and a second inorganic layer 24 coating the recessed surfaces 16.

Figure 3:
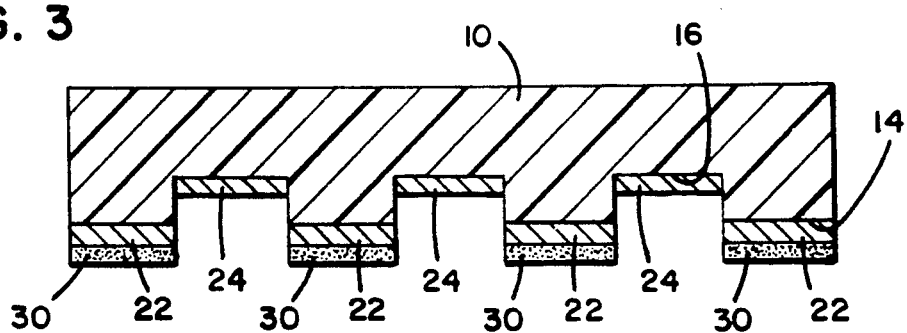
FIG. 3 is a schematic cross-section of the article of FIG. 2 coated with an adhesive layer over the raised surface portions of the embossed surface.

Referring to FIG. 3, an adhesive layer 30 is shown which coats the first inorganic layer 22 coating the raised surfaces 14.

Figure 4:
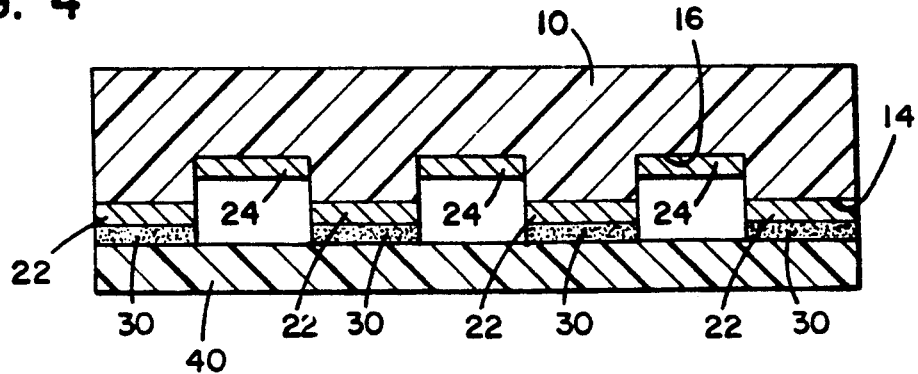
FIG. 4 is a schematic cross-section of the article of FIG. 3 having a transfer substrate laminated to the adhesive layer.

Referring now to FIG. 4, a transfer substrate 40 is shown in contact with the adhesive layer 30. The adhesive is selected so that the adhesive bond between transfer substrate 40 and inorganic layer 22 is greater than the strength of the bond between the raised surface portion 14 and inorganic layer 22. Such relative bonding strength ensures that when transfer substrate 40 and embossed substrate 10 are separated, inorganic layer 22 will cleanly separate from the raised surface portion 14 and remain bonded to transfer substrate 40.

Figure 5:
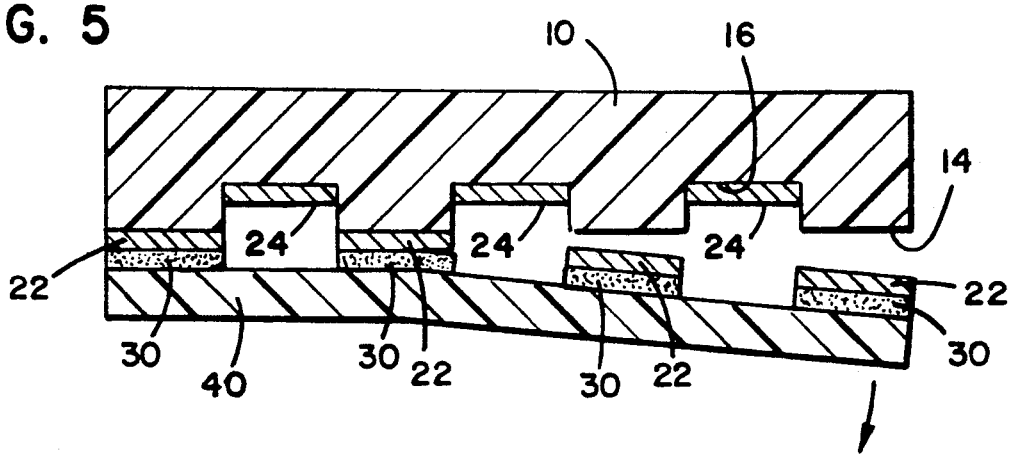
FIG. 5 depicts the article of FIG. 4 wherein the transfer substrate and the embossed substrate are being separated.

Referring now to FIG. 5, transfer substrate 40 is shown being separated from embossed substrate 10. Inorganic layer 22 separates from embossed substrate 10, while remaining bonded to transfer substrate 40. Inorganic layer 24 coating recessed surfaces 16 remains bonded to embossed substrate 10.

Figure 6:
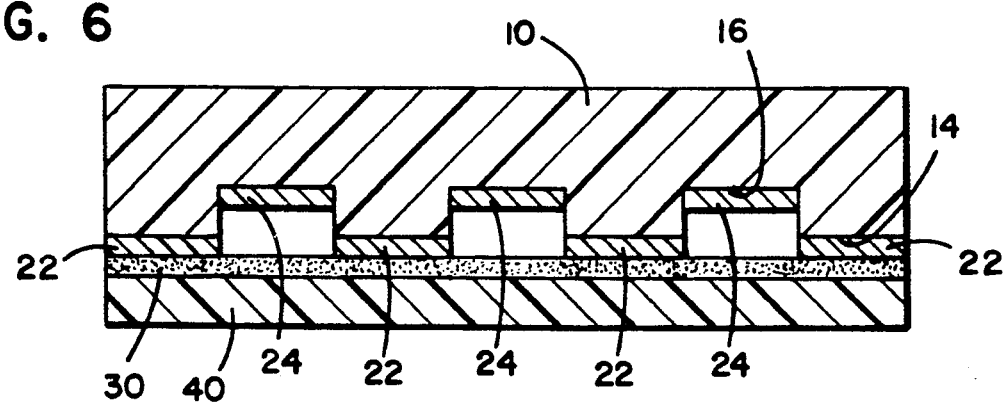
FIG. 6 is a schematic cross-section of an alternative embodiment of the article of FIG. 4 wherein the adhesive layer was coated onto the transfer substrate.
Figure 7:
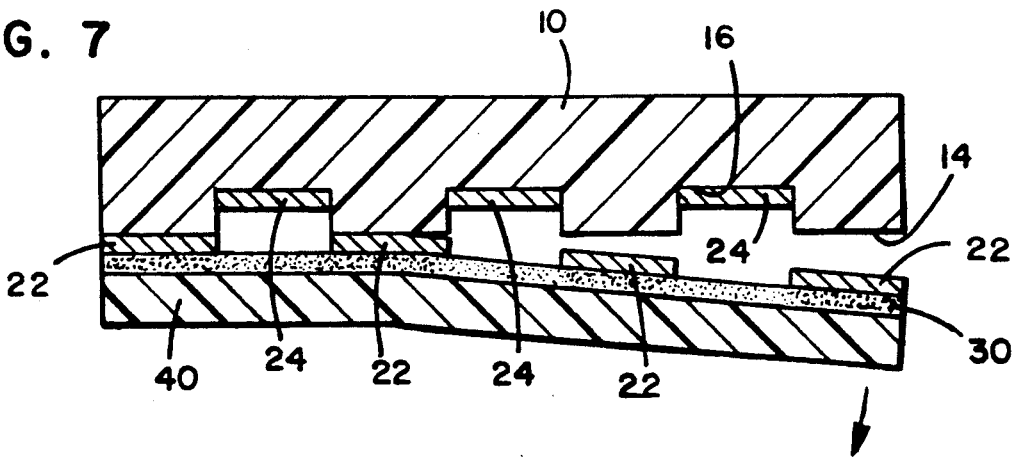
FIG. 7 depicts the article of FIG. 6 where the transfer substrate and the embossed substrate are being separated.

Referring now to FIGS. 6 and 7, an alternative embodiment of the present invention is shown. In this embodiment, adhesive layer 30 is coated onto transfer substrate 40 rather than onto the inorganic layer raised surface portion 22 of embossed substrate 10. This will result in the use of excess adhesive 30, but should not affect the ability of the final article to achieve the desired characteristics.

Figure 8:
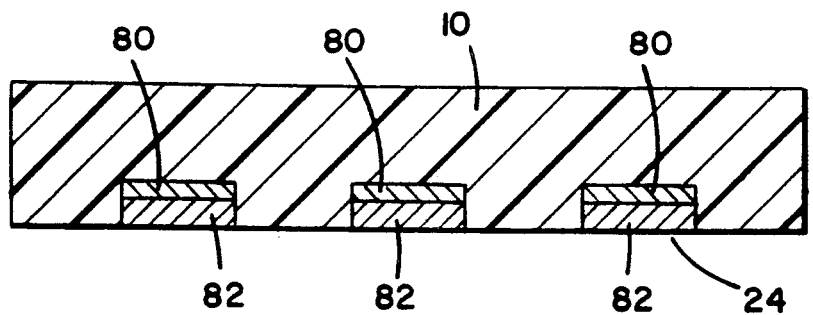
FIG. 8 is a schematic cross-section of the embossed substrate of FIG. 5 after separation of the embossed and transfer substrates wherein a second inorganic layer has been deposited into the recessed surface portions of the embossed substrate.

Referring to FIG. 8, the embossed substrate 10 of FIG. 7 is shown after transfer substrate 40 has been separated therefrom and removed inorganic layer 22 from the raised surface portion 14 of the embossed substrate 10. The inorganic layer 24 has been thickened by depositing a second inorganic layer 82 over a first inorganic film 82 coating the recessed surface portion layer 16 of embossed substrate 10. The second inorganic layer 82 is deposited within the recesses of the embossed substrate 10 such that the second inorganic layer 82 is substantially flush with the raised surface portion 14 of embossed substrate 10.

Figure 9:
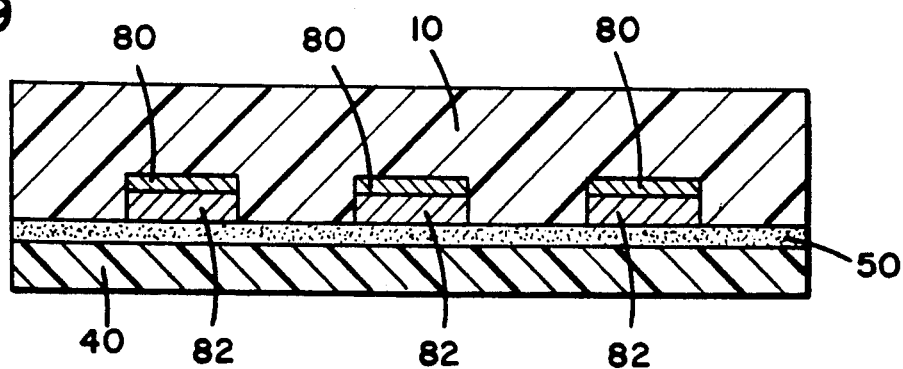
FIG. 9 is a schematic cross-section of the article of FIG. 8 with a transfer substrate adhesively laminated thereto.

Referring to FIG. 9, an adhesive 50 coated transfer substrate 40 is shown laminated to embossed surface 12 of embossed substrate 10. As in FIG. 4, the adhesive 30 is selected so that the adhesive bond between transfer substrate 40 and second inorganic film 82 as well as the bond between second inorganic layer 82 and first inorganic film 80 are greater than the strength of the bond between embossed substrate 10 and the first inorganic film 80 of the layer 24. Such relative bonding strength ensures that when transfer substrate 40 and embossed substrate 10 are separated, both first and second films 80 and 82 will cleanly separate from embossed substrate 10 and remain bonded to transfer substrate 40.

Figure 10:
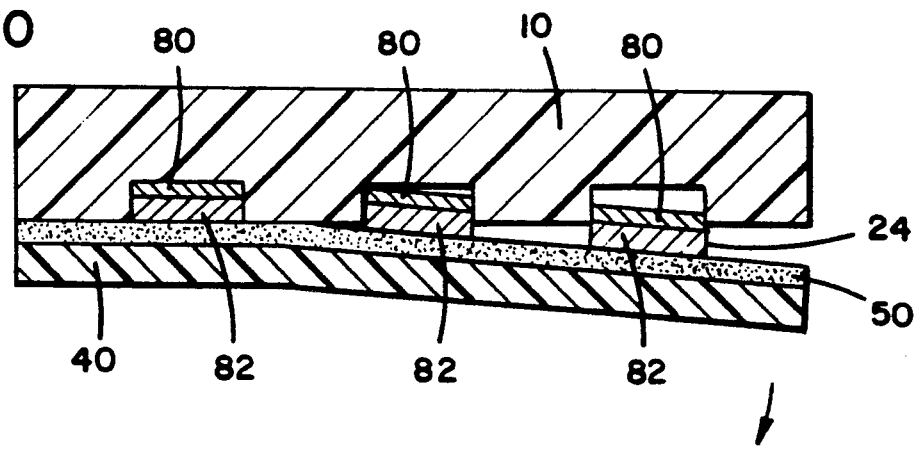
FIG. 10 depicts the article of FIG. 9 wherein the transfer substrate and the embossed substrate are being separated.

Referring now to FIG. 10, transfer substrate 40 is shown being separated from embossed substrate 10. Due to the relative bonding strengths discussed above, such separation causes inorganic layer 24 to separate from embossed substrate 10 and remain bonded to transfer substrate 40.

Figure 11:
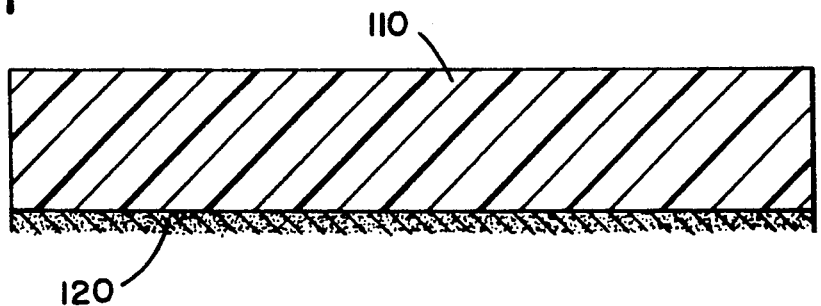
FIG. 11 is a schematic cross-section of an embossable substrate having a powder layer over a first surface thereof.

Referring to FIG. 11, an embossable substrate 110 is shown with a layer of inorganic powder 90 deposited on a first surface 120 thereof.

Figure 12:
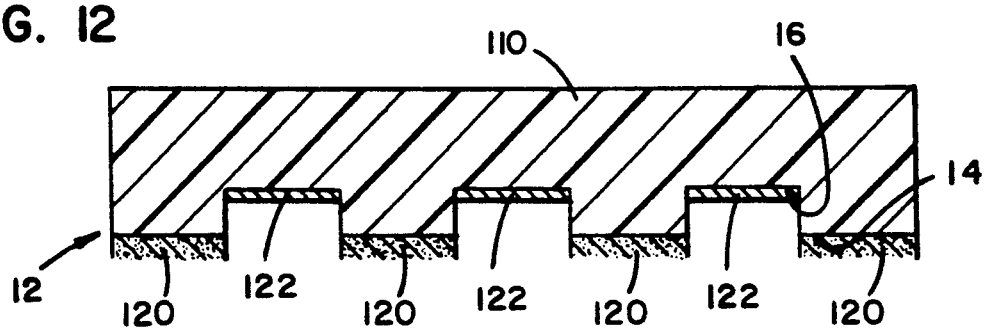
FIG. 12 is a schematic cross-section of the article of FIG. 11 after the embossable substrate has been embossed to form a relief pattern upon the first surface and loose powder has been removed.

Referring now to FIG. 12, the powder coated on an embossable substrate 110 of FIG. 11 is shown after the embossable substrate 110 has been embossed to form a relief surface 12 to form raised surface portions 14 and recessed surface portions 16. The powder layer 122 overlaying recessed surface portions 16 has been pressure formed to substantially evenly coat recessed surface portions 16 and bond to the now embossed substrate 110 while the inorganic powder 120 coating the raised surface portions 14 of the now embossed substrate 110 remains in a loose, powder form and may be removed from now embossed substrate 110 by any of a number of means.

The present invention involves providing a relief pattern upon a substrate 10 which is then coated with one or more thin films to comprise inorganic layers 22, 24. The embossed substrate 10 can be made from any embossable material having a sufficient structural integrity. Preferred materials include plastics such as polypropylene, polyethylene, polyesters, cellulose acetate, polyvinylchloride, and polyvinylidinefluoride, as well as other materials such as cellulose. One method of embossing the substrate, is to extrude softened polymers onto a machined embossing roll having an imprinted negative of the desired pattern and then imprinting the design into the polymer.

Vapor coating is the preferred method of depositing the inorganic films onto the embossed substrate 10. Accordingly, the inorganic layers 22, 24 are preferably a metal which can be vapor coated. The particular inorganic material employed also depends upon the desired end use of the resultant composite. For uses in which electrical conductivity is important, metals which have a high electrical conductivity should be chosen. When aesthetic characteristics are important, materials with the desired specular reflection, color, texture and the like should be chosen.

It is preferred that the vapor coating be done at an angle perpendicular to the relief surface 12 of the embossed substrate 10 so that little or no inorganic is deposited on the vertical walls 18 of the relief surface 12. Reducing the deposit of inorganic on the vertical walls 18 reduces the bond between the inorganic layer 22 on the raised surface portions 14 and the inorganic layer 24 on the recessed surface portions 16 and thereby allows the clean transfer of inorganic layer 22 to a transfer substrate 40.

Suitable inorganics for use as layers 22, 24 include aluminum, nickel, copper, gold, silver, chromium, indium, indium tin, indium tin oxide, alumina, silica, ZnS, SiO, cryolite, titania, silicon, germanium, gallium arsenide, mixtures and alloys of these as well as mixtures of the metals and alloys. In addition, multiple layers of the same or different inorganic films may be applied, as desired.

A wide variety of configurations may be selected for the embossed substrate 10. The wide variety of end uses of the present invention requires a wide variety of different shapes, sizes, configurations, patterns and the like. In the decorative area, an enormous number of various repeating and random shapes and sizes, such as squares, circles, ellipses, hexagons, diamonds, triangles, dots, etc., may be used. Also, this wide variety of different shapes may be useful in the areas of static control and electromagnetic radiation control. Printed circuits typically comprise a plurality of closely spaced lines intercurved amongst each other in a pattern which provides electrical conductivity between the desired positions on the circuit board. Therefore, the pattern of such a metal film would be dictated by its intended function. The image or pattern which is desired for the end use is produced by embossing the pattern into the embossed substrate 10. The raised surface portion 14 of the embossed substrate 10 defines the ultimate pattern which will result and which is capable of being transferred onto a transfer substrate. The present invention is capable of providing images or patterns of fine detail. For example, 25-100 linear raised surfaces 14 per cm or 625-10,000 raised surfaces 14 per cm$^2$, in the case of dots, squares, triangles and the like.

The thicknesses of the inorganic image or pattern 22 is typically determined by the desired end us and the tolerances of the tooling used to emboss the embossed substrate 10. For most end uses, when the inorganic layer 22, 24 are metal, a thickness of about 0.1-100 $\mu$m is useful. The depth of the recesses, i.e. the distance between the recessed and raised surface portion, is typically about 10-1000 $\mu$m.

A wide variety of adhesives may be chosen for use as the adhesive layer 30 in the present invention. The adhesive must be capable of forming a bond with inorganic pattern or image 22 deposited on the raised surface portion 14 which is greater than the bond between the inorganic pattern or image 22 and the embossed substrate 10. A wide range of both thermoplastic and thermosetting adhesives are useful. So long as the bond strength requirement is met, pressure-sensitive adhesives such as silicones are particularly useful as the adhesive layer 30 in the present invention.

The adhesive layer 30, may be applied only to the inorganic layer 22 on embossed substrate 10 by any of a number of methods, including roll coating. Spray coated adhesives may be applied to both raised 22 and recessed 24 inorganic surfaces. For some applications, ultraviolet and/or electron beam-curable adhesive resins may be desirable.

The inorganic substrate composites of the present invention may be provided in a number of useful forms, such as sheets or rolls of transfer tape.

In an alternative embodiment, an inorganic layer 120 of a powder may be sprinkled onto an unembossed but embossable substrate 110. By embossing the inorganic powder 120 coated surface of the embossable substrate 110 the inorganic powder 120 within the recessed surface portions 16 will be mechanically bonded to substrate 110 while the powder remaining on the raised surface portion 14 of the substrate 110 will remain in loose powdered form and may be easily removed from substrate 110.

Suitable inorganic available in powder form and useful as layer 120 include metals such as aluminum, copper, zinc, iron, nickel, cobalt and their alloys; ceramics, such as alumina, titania, silica, tungsten carbide, boron carbide, titanium carbide, and mixtures thereof.

The remaining composite of an embossed substrate (10, 110) having an inorganic layer 120 on only the recessed surface portions 16 may either be used as such or may be further modified by depositing a second inorganic layer 80 onto inorganic layer 24 so as to fill the recessed surface portions 16. The second inorganic layer 80 may be deposited onto embossed substrate 10, 110 by any suitable means including dipping into molten inorganic which wets only inorganic layer 24 or electroplating.

The multilayer pattern formed by inorganic layers 24 and 80 may be transferred to a transfer substrate 40 by employing an adhesive layer 50 in accordance with the earlier discussion.

By depositing additional inorganic layers or films on the inorganic layer 24 provided on the recessed surface portion 16 allows thicker layers of inorganic materials, such as metal, to be formed with the sidewalls serving as a mold to insure that the layer is deposited uniformly with sidewalls substantially perpendicular to the surface. Where additional layers of inorganic material are deposited on free-standing layers, such as the metal stripes of a conductive tape, variations in the width of the additional layers can occur often causing closely adjoining stripes to touch and make undesirable electrical connections.

The invention is further described by the following detailed examples.

EXAMPLE 1

A square piece of plexiglas 0.6 cm thick and 12.5 cm on a side had grooves cut into its surface with a diamond saw. The grooves were 225 $\mu$m wide and 125 $\mu$m deep. The grooves were cut so as to leave the surface with rectangular projections 75 $\mu$m by 200 $\mu$m for a density of about 800 rectangles per cm$^2$. The grooved side of the plexiglas was coated with about 0.15 um of aluminum in a vacuum bell jar. A pressure sensitive acrylic adhesive tape (Scotch 600 transparent tape DC/part no 021200-07457 available from 3M Co.) was laminated to the aluminum coated plexiglas. Delamination of this tape transferred the metal deposited on the top of the rectangular projections from the plexiglas to the tape. The aluminum at the bottom of the groves was not removed from the plexiglas.

EXAMPLE 2

An embossed film of polypropylene was obtained which had multiple square projections 50 μm on a side. The grooves separating the square projections were 50 μm wide and 50 μm deep. This embossed film was vapor coated with about 0.15 μm of aluminum in a vacuum bell jar. The metalized film was then laminated to a pressure sensitive adhesive tape of the type used in Example 1. Subsequent delamination of the tape transferred the 50 μm by 50 μm squares of aluminum from the polypropylene to the tape. Up to at least 98 lines (dots) per cm or 9600 dots per cm$^2$ can be transferred by this process without a significant loss in detail.

EXAMPLE 3

A section of 250 μm thick cast polyethylene terephthalate was embossed to provide a discontinuous major surface of protruding squares 0.25 cm on a side. The squares were separated from each other by recessed continuous surfaces 0.75 mm wide, and 0.125 mm deep which traversed the entire length of the substrate and intersected like surfaces so as to form 90 degree angles therewith. This embossed film was coated with copper by electron beam evaporation in a vacuum roll coater to provide about a 0.15 μm thick film of copper over both the raised and recessed surfaces. The copper coated raised surface was then laminated to pressure sensitive adhesive tape of the type used in Example 1 using a hand held roller. Removal of the tape from the embossed film removed the copper film from the raised surfaces which permitted the passage of visible light through the raised square surfaces. The copper in the recessed surfaces was conductive and continuous.

EXAMPLE 4

The embossed substrate of Example 3, after removal of the copper film from the raised surfaces, was placed in a copper plating bath (copper sulphate bath) at room temperature and electroplated at a current density of 0.006 amps per cm. Copper was plated until the thickness had been increased to about 100 μm.

EXAMPLE 5

The embossed substrate of Example 3, after removal of the copper film from the raised surfaces was dipped into a molten quaternary eutectic alloy of bismuth, lead, tin, and indium at 86° C. Removal of the material from the molten metal revealed that the metal had wet and coated only those regions containing copper, e.g. the continuous, recessed surfaces. Separation of the dip coated metal from the polymer substrate provided for a self-supporting film that reproduced the image of the recessed surface of the embossed film. The thickness of this metal film was about 200 μm.

EXAMPLE 6

The embossed film of Example 3 was coated with alternate layers of copper and nickel (0.15 μm of copper, 0.15 μm of nickel, 0.15 μm of copper). This metal sandwich was spray coated with SCOTCH brand spray mount acrylic adhesive, (available from the 3M Co. under cat. no. 6065 and ID No 62-6065-4826-1). The adhesive was bonded to SCOTCHCAL brand release liner for further use. Later, the release liner was removed and the imaged transfer tape was laminated to KAPTON, a polyimide available from DuPont, and then delaminated to transfer the metal sandwich layer to the polyimide. In like manor, such imaged metal layers were also transferred to a variety of other substrates including glass, paper and aluminum.

EXAMPLE 7

A 10 cm by 10 cm by 0.25 mm piece of cast polyethylene terepthalate (PET) was coated on one side with a layer of fine copper powder with an average particle size of 50 μm. The powder coating was just sufficient to completely cover the surface with a monolayer of particles. A copper embossing plate, having a surface relief pattern similar to that described in Example 3, was heated to 150° C. and pressed against the powder coated side of the PET for 5 seconds at a pressure of 70 kPa. A pattern of copper powder corresponding to the pattern on the copper plate was embedded into the surface of the PET. The excess copper powder was brushed off the PET surface. The PET was then dipped into a solution of 1 part concentrated hydrochloric acid and 9 parts water for 5 seconds, rinsed in water, and dried. The PET was then dipped for one second into a molten quaternary eutectic alloy of bismuth, lead, tin, and indium at 85° C. The molten metal wet the pattern of copper powder embedded in the PET to form a square pattern of the bismuth-lead-tin indium metal on the PET. The resulting metal pattern was roughly 50 μm thick.

What is claimed is:

1. A metal/polymer composite comprising:
   a) a flexible sheet-like polymeric substrate having a front surface and a back surface, said front surface having a relief pattern formed therein, said relief pattern having a raised surface portion and a recessed surface portion, the raised surface portion and the recessed surface portion are substantially parallel to each other and joined by a side wall portion, the height of the sidewall portion is 10 to 1000 micrometers;
   b) a metal layer adhered solely to said recessed surface portion having a thickness of 0.1 to 100 micrometers.

2. The metal/polymer composite of claim 1 wherein said raised surface portions are a regular array of linearly extending projections, said regular array having 25 to 100 projections per cm.

3. The metal/polymer composite of claim 1 wherein said recessed surface portion is continuous and said raised surface portion is a regular array of discrete projections, said regular array including 625 to 10,000 projections per square cm, said metal layer adhered to said recessed surface portion being laterally electrically conductive.

4. The metal/polymer composite of claim 1 wherein said raised surface portion is continuous and said recessed surface portion is a plurality of discrete recesses, said regular array including 625 to 10,000 recesses per square cm.

5. The metal/polymer composite of claim 1 further including an adhesive layer provided on the raised surface portion.

6. The metal/polymer composite of claim 5 further including a release liner removably adhered to said adhesive layer.

7. The metal/polymer composite of claim 6 provided as a roll of said composite wound upon itself.

8. A metal/polymer composite comprising:
a) a flexible sheet-like polymeric substrate having a front surface and a back surface, said front having a relief pattern formed therein, said relief pattern including a raised surface portion, a recessed surface portion, sand a side wall portion, said side wall portion substantially perpendicular to the raised surface portion and the recessed surface portion, the side wall portion having a height of 10 to 1000 micrometers;
b) a metal layer adhered solely on said recessed surface portion and having a top surface that is substantially flush with the raised surface portion of said relief pattern, said metal layer having a thickness equal to the height of the side wall portion.

9. The metal/polymer composite of claim 8 wherein said raised surface portions are a regular array of linearly extending projections, said regular array having 25 to 100 projections per cm, and said metal layer being a regular array of linearly extending electrically conductive members.

10. The metal/polymer composite of claim 8 wherein said recessed surface portion is continuous and said raised surface portion is a regular array of discrete projections, said regular array including 625 to 10,000 projections per square cm, wherein said metal layer being laterally electrically conductive.

11. The metal/polymer composite of claim 8 wherein said raised surface portion is continuous and said recessed surface portion is a regular array of discrete recesses, said regular array including 625 to 10,000 recesses per square cm.

12. The metal/polymer composite of claim 8 further including an adhesive layer provided on the raised surface portion and the top surface of the metal layer.

13. The metal/polymer composite of claim 12 further including a release liner removably adhered to said adhesive layer.

14. The metal/polymer composite of claim 13 provided as a roll of said composite wound upon itself.

15. The metal/polymer composite of claim 8 wherein said metal layer includes a first metal layer comprising a metal powder adhered directly to said recessed surface and a second metal layer comprising a continuous metal layer integral with said metal powder and flush with the raised surface portion.

16. A metal/polymer composite of claim 8 wherein said metal layer comprises a first metal layer adhered directly to said recessed surface and a second metal layer that is flush with the raised surface portion; said first and second metal layer made of two separate metals or metal alloys.

17. A metal/polymer composite comprising:
a) a flexible sheet-like polymeric substrate having a front surface and a back surface, said front surface having a relief pattern formed therein, said relief pattern having a raised surface portion and a recessed surface portion, the raised surface portion and the recessed surface portion are substantially parallel to each other and joined by a side wall portion, the height of the sidewall portion is 10 to 1000 micrometers;
b) a first and second metal layer adhered directly to said raised surface portion and said recessed surface portion, respectively, said metal layers each having a thickness of 0.1 to 100 micrometers.

18. The metal/polymer composite of claim 17 wherein said raised surface comprises a regular array of about 25 to 100 linearly extending projections per linear cm, said metal/polymer composite provided as a roll of said composite wound upon itself so as to provide an image transfer tape, with the metal layer provided on said raised surface portion transferable to a remote substrate, and adherable to said remote substrate by means of said adhesive layer.

19. The metal/polymer composite of claim 17 wherein said recessed surface portion is continuous and said raised surface comprises a regular array of discrete projections, said regular array including about 625 to 10,000 projections per square cm, said metal/polymer composite provided as a roll of said composite wound upon itself so as to provide an image transfer tape, with the metal layer provided on said raised surface portion transferable to a remote substrate, and adherable to said remote substrate by means of said adhesive layer.

20. A metal/polymer composite comprising:
a) a flexible sheet-like polymeric substrate having a front surface and a back surface, said front surface having a relief pattern formed therein, said relief pattern having a raised surface portion and a recessed surface portion, the raised surface portion and the recessed surface portion are substantially parallel to each other and joined by a side wall portion, the height of the sidewall portion is 10 to 1000 micrometers; and
b) a metal powder layer adhered solely to said raised surface portion having a thickness of 0.1 to 100 micrometers.

21. The metal/polymer composite of claim 20 wherein said polymeric substrate is substantially transparent.

* * * * *

UNITED STATES PATENT AND TRADEMARK OFFICE
CERTIFICATE OF CORRECTION

PATENT NO. : 5,219,655

DATED : June 15, 1993

INVENTOR(S) : Calhoun et al.

It is certified that error appears in the above-identified patent and that said Letters Patent is hereby corrected as shown below:

Column 9,
In claim 8, subpar. a), line 14, for "sand" read --and--.
Column 10,
In claim 20, subpar. b), line 50, for "raised" read --recessed--.

Signed and Sealed this

Sixth Day of June, 1995

Attest:

BRUCE LEHMAN

Attesting Officer

Commissioner of Patents and Trademarks